United States Patent [19]

Herndon

[11] 4,104,734
[45] Aug. 1, 1978

[54] LOW VOLTAGE DATA RETENTION BIAS CIRCUITRY FOR VOLATILE MEMORIES

[75] Inventor: William H. Herndon, Sunnyvale, Calif.

[73] Assignee: Fairchild Camera and Instrument Corporation, Mountain View, Calif.

[21] Appl. No.: 811,806

[22] Filed: Jun. 30, 1977

[51] Int. Cl.² .................... G11C 11/40; G11C 13/00
[52] U.S. Cl. .................................. 365/228; 365/154; 365/195; 365/206; 365/227; 307/238
[58] Field of Search .................... 340/173 R, 173 FF; 307/238, 279

[56] References Cited

U.S. PATENT DOCUMENTS

| | | | |
|---|---|---|---|
| 3,644,907 | 2/1972 | Gricchi | 340/173 FF |
| 3,713,115 | 1/1973 | Duben | 340/173 CP |
| 3,774,177 | 11/1973 | Schaffer | 340/173 LI |
| 3,811,090 | 5/1974 | Uchida | 340/173 CP |
| 3,971,004 | 7/1976 | Dingwell | 340/173 FF |
| 4,006,469 | 2/1977 | Leehan | 340/173 CP |

Primary Examiner—Terrell W. Fears
Attorney, Agent, or Firm—Alan H. MacPherson; Robert C. Colwell

[57] ABSTRACT

Circuitry that senses a drop in the power supply voltage and turns off bias voltages in the proper sequence to prevent further writing into the cells of a random access memory while permitting the cells to remain in a low supply voltage standby to retain their stored data.

6 Claims, 1 Drawing Figure

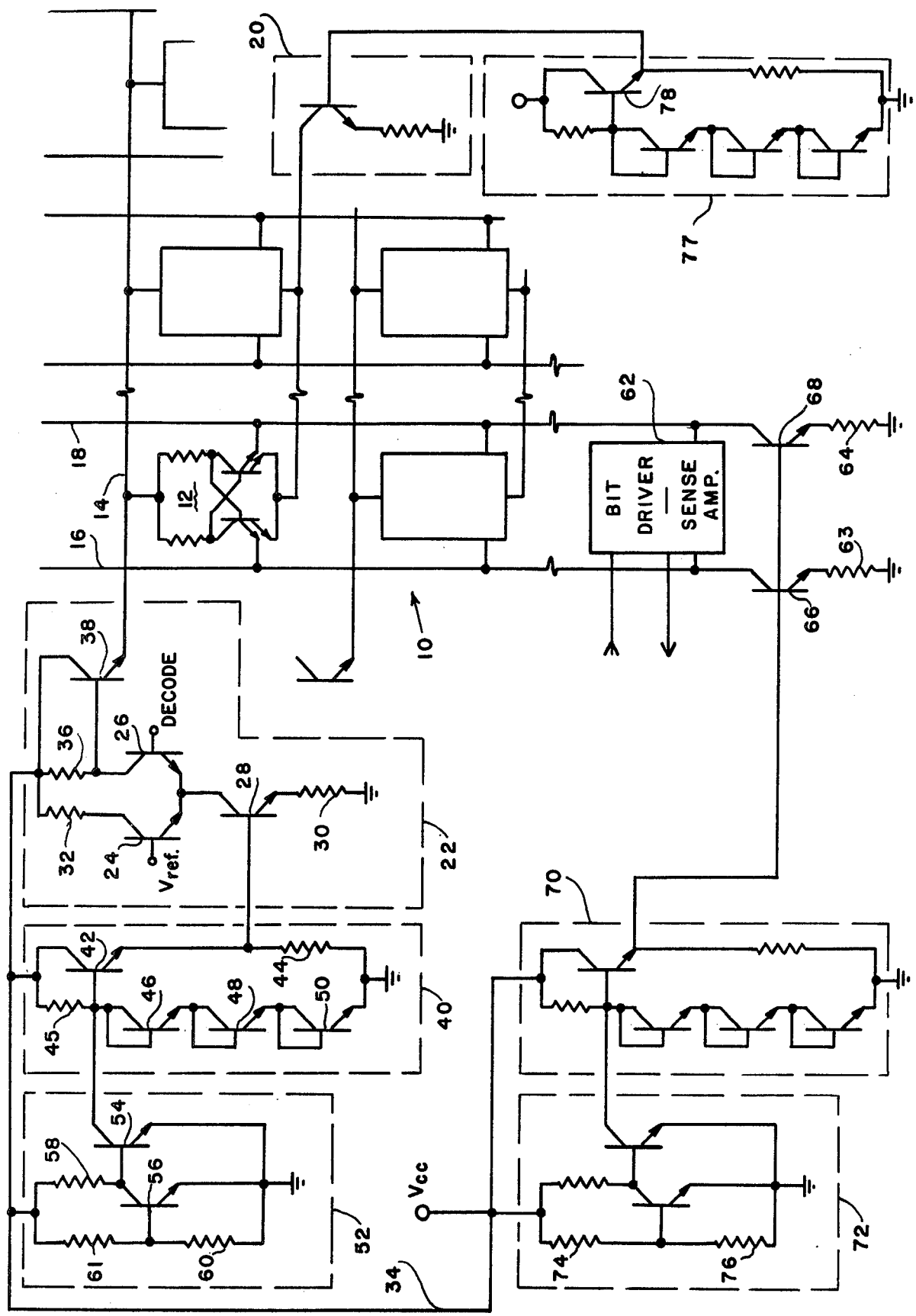

LOW VOLTAGE DATA RETENTION BIAS CIRCUITRY FOR VOLATILE MEMORIES

SUMMARY OF THE INVENTION

This invention relates to protection circuitry for volatile digital devices and particularly to circuitry that controls shutdown sequences of volatile memory circuits, such as shift registers, counters, and random access memories, or the like, so that the memories may retain their data with very low standby power.

Most digital memories are volatile in that the stored data is lost if power is removed from the cells. Modern semiconductor circuits, however, can retain stored data if a very low D.C. standby voltage is maintained and the individual cells are not disturbed by reading and writing attempts. Thus, in the event of power failure, a relatively small bias battery may be used to preserve valuable data that would otherwise be lost if the system power supply failed or there was a serious voltage drop.

Uncontrolled and undesirable voltage variations can produce disastrous results in a bipolar memory. For example, in a conventional TTL multiple-emitter RAM memory, data are read and written into the cells by selectively raising the word lines and lowering the voltage on bit lines by very small amounts. Therefore, it is apparent that merely holding a memory cell at its low standby power can still produce erroneous results during power supply shutdown and it is therefore necessary, to preserve the data, that the peripheral circuits used to address and write into the memory cells be shut down at a controlled rate and in a proper sequence to prevent the accidental alteration of the stored data.

Briefly described, the invention comprises circuitry that detects a drop in the system power supply voltage and turn off the bias networks in a sequence such that the current into the bit lines is first removed, making it impossible to write into or change the data in the cell as long as the power in the cell is maintained, and then removing the bias current from the word drivers powering the cell to thereby minimize the power supply voltage requirements to maintain a minimum cell current. Turning off these peripheral circuits also minimizes the total power requirements when the power supply voltage is low.

DESCRIPTION OF THE DRAWING

The single FIGURE in the drawing is a schematic diagram illustrating the preferred embodiment of the invention used in conjunction with an ECL multiple-emitter RAM memory.

DETAILED DESCRIPTION OF THE PREFERRED EMBODIMENT

Illustrated in the drawing is a portion of an ECL type multiple-emitter random access memory array 10 comprising a plurality of identical cells, such as cell 12, which comprises a pair of dual emitter NPN transistors cross-coupled in a typical flip-flop configuration. The collectors of each of the two transistors are coupled through collector resistors to a word line 14 and one emitter of each transistor is connected to one of the bit lines 16 and 18. The second emitters of the two transistors in each cell are coupled together and to the collector of transistor 20 operating as a cell current sink which provides unaddressed standby power to each cell. Each of the other horizontal rows are provided with a separate sink such as sink 20.

In the ECL type of memory illustrated, a bit, or cell, is selected and read by raising the voltage on the word line 14 from, for example, 3.2 to 4.2 volts while maintaining substantially equal voltages on the bit lines 16 and 18. Writing data into the cells are accomplished by raising the voltage on the word line 14 and by lowering the voltage on one of the two bit lines 16 or 18. The particular transistor having the lowest emitter voltage will be turned on.

Each word line, such as word line 14 associated with the top horizontal row of cells in the memory array 10, is coupled to a word driver, such as the word driver 22, which will apply the proper standby voltage to the word line 14 and which, when selected by the signal from an external decoder, will raise the voltage on word line 14 to the proper select level.

Word driver 22 includes a word driver switch which comprises a pair of ECL coupled NPN transistors 24, 26, the emitters of which are coupled together and to the collector of a switching transistor 28, the emitter of which is connected through the current source resistor 30 to ground. The collector of transistor 24 is coupled through a resistor 32 to a power supply voltage source 34 and the base of transistor 24 is coupled to a source of reference voltage. The collector of transistor 26 is coupled through a resistance 36 to the voltage source 34 and the collector of transistor 26 is also connected to the base of a driver transistor 38, the collector of which is connected to the voltage source 34 and the emitter of which is connected to the word line 14 associated with the top horizontal row of cells in the memory 10. The base of transistor 26 is connected to an external decoder circuit that selects one of the plurality of rows. For reasons which will be subsequently explained, the value of the resistance 36 is such that approximately 1.2 volts is across it when transistor 26 is on.

The base of the current source switching transistor 28 of the word driver 22 is connected to the output of a word driver bias circuit 40 which normally biases transistor 28 to be conductive. Bias circuit 40 includes an NPN transistor 42, the collector of which is coupled to the source of power supply voltage 34 and the emitter of which is coupled to the base of transistor 28 and through a resistance 44 to ground potential. The base of transistor 42 is coupled through a resistance 45 to the supply voltage source 34 and is also coupled to ground reference through three series coupled NPN transistors 46, 48 and 50 that are diode-connected by intercoupling their respective collectors and bases. Thus, during normal operation, the base of transistor 42 is maintained above ground potential by a voltage corresponding to three times the base-to-emitter voltage of the diode-coupled transistors 46, 48 and 50, or, at a constant voltage level of substantially 2.1 volts. This potential is dropped between the base and emitter of transistor 42 so that the bias applied to the base of transistor 28 will be substantially $2V_{be}$, or approximately 1.4 volts. This value is dropped further between the base and emitter of the transistor 28 in the word driver 22 so that the voltage level appearing on the emitter of transistor 28 is substantially $V_{be}$, or 0.7 volts. To keep the word driver transistor 38 in its active state, the base of transistor 38 must be at a voltage equal to $V_{be}$ higher than its emitter; and its emitter which is coupled through the memory cells, and cell current switch 20, should be maintained at a normal standby bias level of substantially two and one-half times $V_{be}$. Therefore, the base of transistor 38 must be at approximately three and one-half times $V_{be}$ above ground.

To bias the transistor 38 of word driver 22 into its normal non-addressing voltage level, its base must be approximately one volt lower than $V_{cc}$ on the power supply source conductor 34. As previously discussed, the base of transistor 28 is at a value of $2V_{be}$ above ground reference. Since the base of transistor 38 must be at a potential of approximately $1\frac{1}{2}V_{be}$ below $V_{cc}$, the resistor 36 must drop the $1\frac{1}{2}V_{be}$. Since resistor 30 dropped one $V_{be}$ between the emitter of transistor 28 and ground, the same current passing through both resistance 30 and 36 will develop a voltage drop of $1\frac{1}{2}V_{be}$ across resistor 36 if its resistance is one and one-half times the resistance of resistor 30. If the above conditions are met, and the value of the power supply voltage is at least $5V_{be}$, all transistors in the word driver 22 and memory 10 will remain active and stored data will be retained.

Returning now to the description of the circuitry, the word driver bias circuit 40 is controlled by a voltage sensor 52 which detects a drop in power supply voltage and, at a suitable threshhold level, shut down the word driver bias circuit 40. While any suitable voltage sensor will operate with the circuit, the voltage sensor 52 comprises an NPN transistor 54 having its collector coupled to the base of transistor 42 in the bias circuit 40. The emitter of transistor 54 is grounded and the base is coupled to the collector of a second NPN transistor 56, the emitter of which is grounded and the collector of which is coupled to the power supply voltage source 34 through a suitable resistance 58. The base of transistor 56 is coupled to the center of a voltage divider comprising resistances 60 and 61 coupled between ground potential and the power supply voltage source 34. In operation, the resistance ratio of resistor 60 and 61 determine the threshhold voltage level on the base of transistor 56 which is normally conductive. When conductive, the voltage level on the collector of transistor 56 is very close to ground potential and transistor 54 is thereby cut off. If the voltage level of the power supply source 34 drops below the predetermined voltage threshhold, transistor 56 is cut off, thus raising the potential on the base of transistor 54 to turn it on. The collector of transistor 54 is now very close to ground potential, thereby shorting out the series transistors 46, 48 and 50 in the word driver bias circuit 40 and cutting off transistor 42. This, in turn, cuts off conduction through the transistor 28 in the word driver 22.

When transistor 28 in word driver 22 is cut off, the word driver current sink disappears and the current through resistor 36 in the word driver 22 is removed. The voltage drop across resistor 36 therefore disappears and a higher voltage is applied to the base of the word driver transistor 38. This, in turn, increases the voltage on the word line 14 as if it were being addressed during normal operation of the memory, thus subjecting the memory 10 to the possiblity of erroneous writing.

In order to prevent erroneous writing into nonaddressed memory cells during a low power supply voltage shutdown of the memory, it is necessary to turn off the memory columns prior to shutting off the horizontal rows.

The memory 10 includes a plurality of vertical columns of cells interconnected by bit lines, such as bit lines 16 and 18 associated with the cell 12. Bit lines 16 and 18 and all other bit lines are respectively connected to a bit driver, such as bit driver and sense amplifier 62 which, upon the control of an external decoding signal and appropriate control signals, applies appropriate read/write levels to the bit lines 16 and 18. Bit lines 16 and 18 are coupled to the bit driver and sense amplifier 62 and to a suitable current sink network comprised of grounded resistors 63 and 64 in series with transistors 66 and 68, respectively. Transistors 66 and 68 are controlled by a sense amplifier bias circuit 70 that, in all respects, is identical with the word driver bias circuit 40 which was previously described in detail. As in the case with the word driver circuit, the sense amplifier bias circuit 70 is controlled by a voltage sensor 72 which is identical with the word driver voltage sensor 52, except that the threshold determining resistors 74 and 76 in the voltage sensor 72 are selected so that the sensor 72 will be activated at a slightly higher threshold voltage level than the voltage sensor 52.

In operation, therefore, the decreasing voltage level of the power supply will first activate the voltage sensor 72 which, in turn, will shut down the bias circuit 70 so that transistors 66 and 68 will be rendered nonconductive, thus stabilizing the bit lines 16 and 18. After voltage sensor 72 is triggered, the voltage sensor 52 operates to shut off the word driver bias circuit 40 and the switching transistor 28 in the word driver 22. After the bit lines 16 and 18 have been closed down by operation of the voltage sensor 72, variations in the voltage level on word line 14 will have no effect on the stored data and cannot result in erroneous writing into the cells of memory 10.

In an ECL type of memory such as illustrated in the drawing, the second emitters of the dual emitter transistors forming the memory cells are interconnected and to the collector of the cell current switch 20, as previously discussed. Cell current switch 20 is an NPN transistor, the base of which is coupled to the emitter of a cell current source bias supply 77 which preferably is identical with the word driver bias circuit 40 and the sense amplifier bias circuit 70. The purpose of the cell current bias circuit 77 is to maintain each of the transistors in the memory 10 in minimum standby condition so that the data stored therein will be retained until the various circuits are revived by an increase in the power supply voltage level. As discussed in connection with the word driver bias circuit 40, the cell current bias circuit 77 includes three diode-connected NPN transistors in series between the base of the transistors 78 and the ground reference. Therefore, the base of transistor 78 is biased to a level equal to $3V_{be}$ above ground so that the emitter of transistor 78 and the base of the cell current switching transistor 20 is at a level of $2V_{be}$ above ground reference. The current is slightly attenuated by transistor collector resistance so that the potential at the collector of the cell current switching transistor 20 is approximately $1\frac{1}{2}V_{be}$ which, when applied to the emitters of the memory cell transistors, will hold them in an active state, thus retaining the data stored therein. The current drawn by the cell current bias circuit 77 and all the transistors in the memory 10 is exceedingly small and, if desired, can be maintained in this state indefinitely by an appropriate battery or other reserve source.

It is to be understood that although the description of the preferred embodiment described the invention in connection with an ECL type of multiple-emitter random access memory cell, the circuitry of the invention may be used with other types, such as TTl, diode-coupled cells, Weidmann-Berger memory cells, or any type of volatile memory device in which the individual cells are selected in the manner described herein.

What is claimed is:

1. Memory control circuitry for supplying operating bias and for controlling the removal of said bias from a volatile memory without loss of data therefrom, said memory having at least one row and column of binary storage cells respectively coupled to a corresponding number of word lines and bit line pairs, said memory control circuitry including:

word driver circuitry coupled to each of said word lines, said driver circuitry having biasing means for applying a normal standby bias level to said word line and having switching means responsive to a decoder signal for applying an address voltage level to said word line;

word driver bias circuitry coupled to said word driver circuitry, said word driver bias circuitry having bias determining means for establishing a predetermined bias voltage level and for applying said voltage level to said word driver circuitry for the control of said biasing means;

cell current bias circuitry coupled to each cell in a row of cells in said memory, said cell current bias circuitry having means for establishing a predetermined bias level for applying to each of said cells the minimum unaddressed power required to retain the data stored therein; and first voltage sensing means coupled to said word driver bias circuitry and to the memory power supply voltage source for disabling said bias determining means when said voltage sensing means detects a drop in power supply voltage to a first voltage level.

2. The circuitry claimed in claim 1 wherein said word driver bias circuitry includes a transistor coupled between said power supply voltage source and ground reference, the base of said transistor being biased above said ground reference by a plurality of PN junctions.

3. The circuitry claimed in claim 1 wherein said word driver bias circuitry is coupled to control a normally conductive current switching element in said word driver circuitry, said switching element being rendered nonconductive by the disabling of said word driver bias circuitry by said voltage sensing means.

4. The circuitry claimed in claim 3 further including sense amplifier bias circuitry coupled to control normally conductive switching elements associated with a current sink network coupled between ground reference and each bit line pair in said memory, said sense amplifier bias circuitry having bias determining means for establishing a predetermined bias voltage level and for applying said voltage level to said switching elements.

5. The circuitry claimed in claim 4 further including second voltage sensing means coupled to said memory power supply voltage source for disabling said sense amplifier bias circuitry when said second voltage sensing means detects a drop in power supply voltage to a second voltage level.

6. The circuitry claimed in claim 5 wherein said second voltage level is between said first voltage level and the normal operating level of said power supply voltage source, whereby the current in said bit lines will be disabled prior to disablement of said word line.

* * * * *